(12) United States Patent
Wu

(10) Patent No.: US 6,465,885 B1
(45) Date of Patent: Oct. 15, 2002

(54) POSITIONING OF SOLDERING PADS IN SEMICONDUCTOR DIODE PACKAGE

(76) Inventor: Jiahn-Chang Wu, 15, Lane 13, Alley 439, Her-Chiang Street, Chu-Tung, Hsinchu (TW)

(*) Notice: Subject to any disclaimer, the term of this patent is extended or adjusted under 35 U.S.C. 154(b) by 0 days.

(21) Appl. No.: 09/690,708

(22) Filed: Oct. 18, 2000

(51) Int. Cl.[7] .......................... H01L 23/48; H01L 23/52; H01L 29/40
(52) U.S. Cl. .................. 257/734; 257/778; 257/779; 257/780; 257/781; 257/784
(58) Field of Search ................. 257/734, 673, 257/778, 779, 780, 773, 738, 786, 781, 784; 438/121, 108, 122, 123, 612, 613, 615, 617

(56) References Cited

U.S. PATENT DOCUMENTS

| | | | | |
|---|---|---|---|---|
| 4,766,479 A | * | 8/1988 | Krum et al. | 257/737 |
| 5,914,536 A | * | 6/1999 | Shizuki et al. | 257/778 |
| 5,917,242 A | * | 6/1999 | Ball | 257/737 |
| 6,104,091 A | * | 8/2000 | Ito et al. | 257/738 |
| 6,157,080 A | * | 12/2000 | Tamaki et al. | 257/738 |

* cited by examiner

Primary Examiner—Olik Chaudhuri
Assistant Examiner—Theresa T. Doan
(74) Attorney, Agent, or Firm—H. C. Lin

(57) ABSTRACT

The soldering pads on metal contacts for connection to the electrodes of a semiconductor diode chip are surrounded with a coating of insulating material to prevent the spreading of the molten solder, which may cause misalignment of the chip with respect to the package.

8 Claims, 10 Drawing Sheets

POSITIONING OF SOLDERING PADS IN SEMICONDUCTOR DIODE PACKAGE

BACKGROUND OF THE INVENTION (1) Field of Invention

This invention relates to semiconductor diode packages, particular to photoelectric diodes.

(2) Brief Description of Related Art

FIG. 1 shows a prior art method for soldering a semiconductor diode 10 to two metal contacts 11 and 12. Solders 103m and 104m are placed over the contact 11 and 12 respectively for soldering to the electrodes of the semiconductor diode 10. When the package is heated for soldering, the solders 103m and 104m melt and may spread. If the solders 103m and 104m spread, the diode 10 may be displaced from the desired position. This displacement is undesirable, especially for photoelectric devices where the positioning of the light source or light sensor is critical

SUMMARY

An object of this invention is to position a diode accurately in a semiconductor package.

Another of this invention is to prevent the solder in a package from spreading.

These objects are achieved in this invention by coating the surrounding of the soldering pads with insulating material which prevents spreading. Then the soldering islands can accurately mate with the electrodes of the diode.

DETAILED DESCRIPTION OF THE INVENTION

Figure 1:
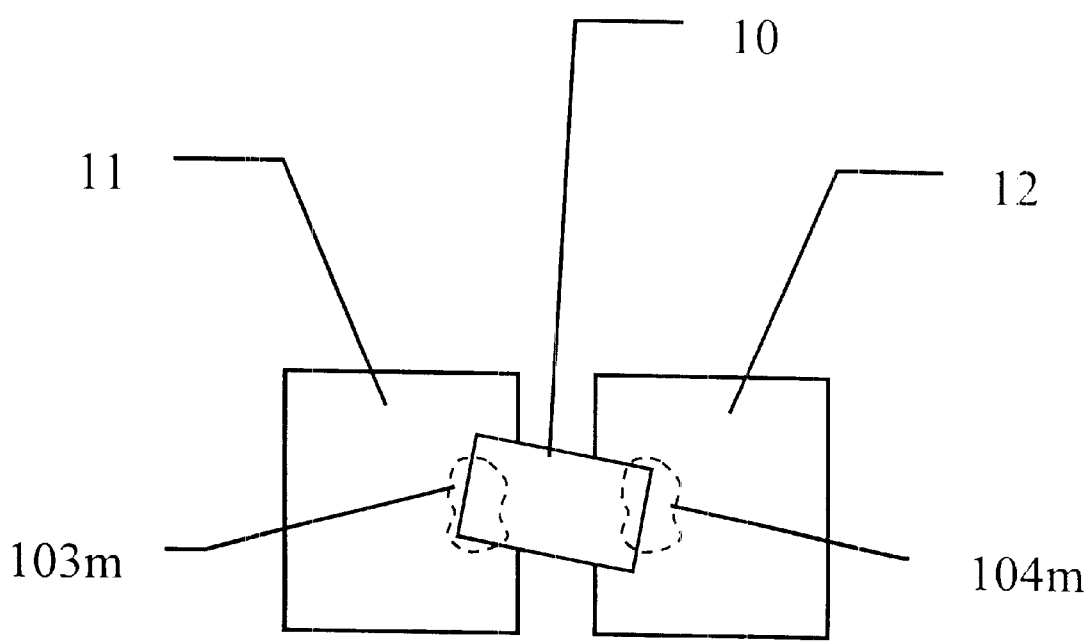
FIG. 1 shows the spreading of the solders over a metal contact in prior art.
Figure 2:
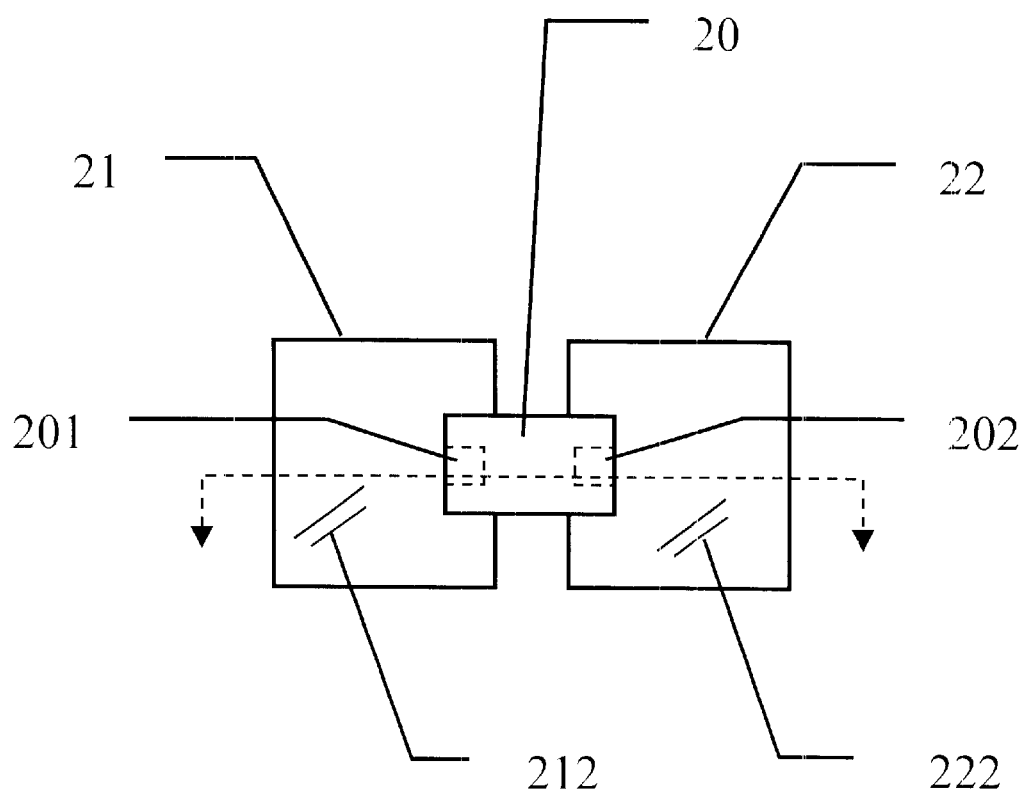
FIG. 2 shows the coating outside the soldering areas of the present invention.

FIG. 2 shows the top view of the present invention. A semiconductor chip 20 is placed over two metal contacts 21, 22. The chip 20 has two bottom electrodes 201. 202, mating with two soldering pads on the metal contacts 21, 22, respectively. The metal contact 21 is coated with insulating material 212 outside surrounding the soldering pad which mates with the electrode 201, and the metal 22 is coated with insulating material 222 outside surrounding the second soldering pad which mates with the electrode 202. Only the first soldering pad is exposed for soldering a first electrode 201 of the semiconductor chip 20, and only the second soldering pad is exposed for soldering a second electrode 202 of the chip 20. The coatings 212 and 222 prevent the melted solder at the first and second soldering pads respectively from spreading.

Figure 3:
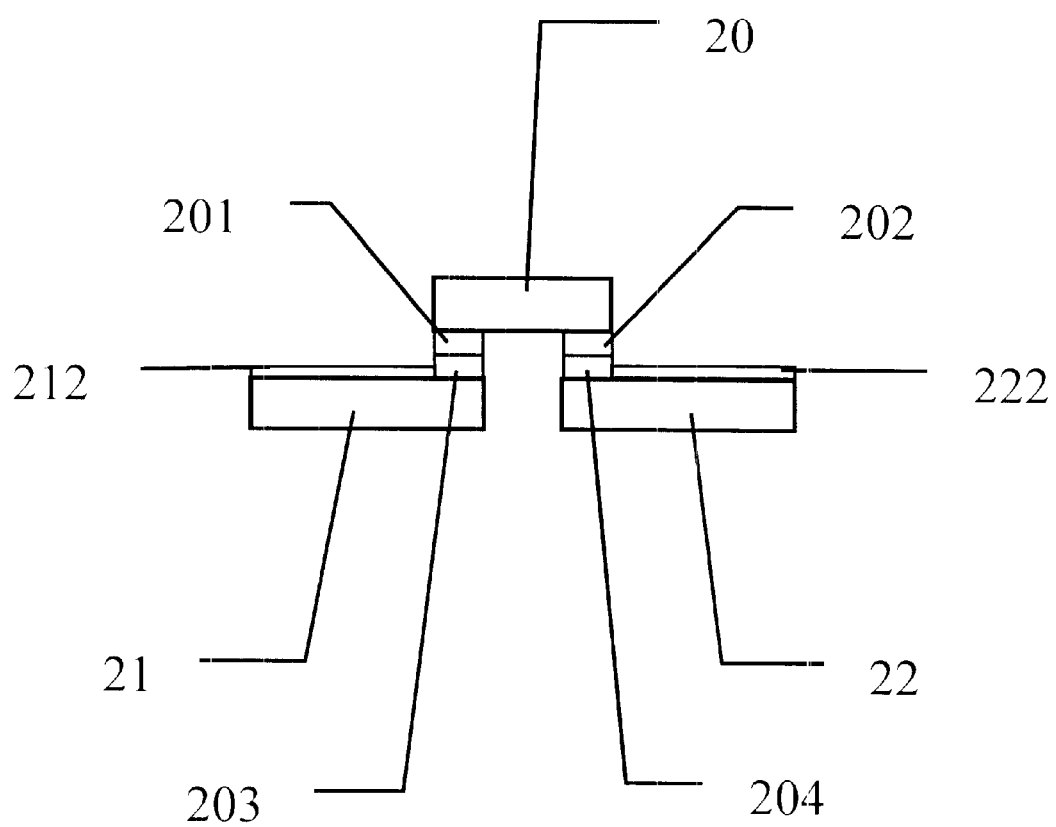
FIG. 3 shows the side view of FIG. 2.

FIG. 3 shows the side view of FIG. 2 along the dotted section line. The contact metal 21 is coated with the insulating material 212 except at the soldering pad 203 to allow mating with the electrode 201 of the diode chip 20. The contact metal 22 is coated with the insulating material 222 except at the soldering pad 204 to allow mating with the electrode 202 of the diode chip 20.

Figure 4:
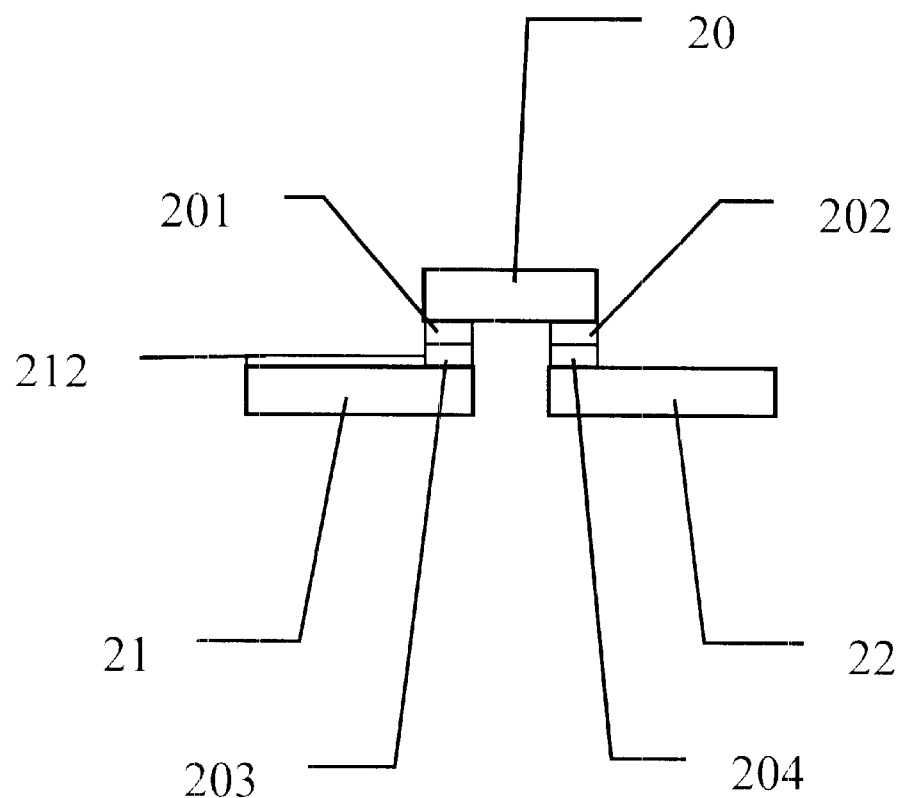
FIG. 4 shows a second embodiment of the present invention.

FIG. 4 shows a second embodiment of this invention, which is a variation of the structure shown in FIG. 3. Only the contact 21 is coated with the insulating material 212 except at the soldering pad 203 to allow mating with the electrode 201 of the diode chip 20. However the contact 22 is not coated with any insulating material. Since the position of the chip is already fixed by the mating of solder pad 203 with the electrode 201, the solder pad 204, which is fixed in position relative to the solder pad 203 is automatically aligned with the electrode 202, which is also fixed in position relative to the electrode 201 on the chip 20.

Figure 5:
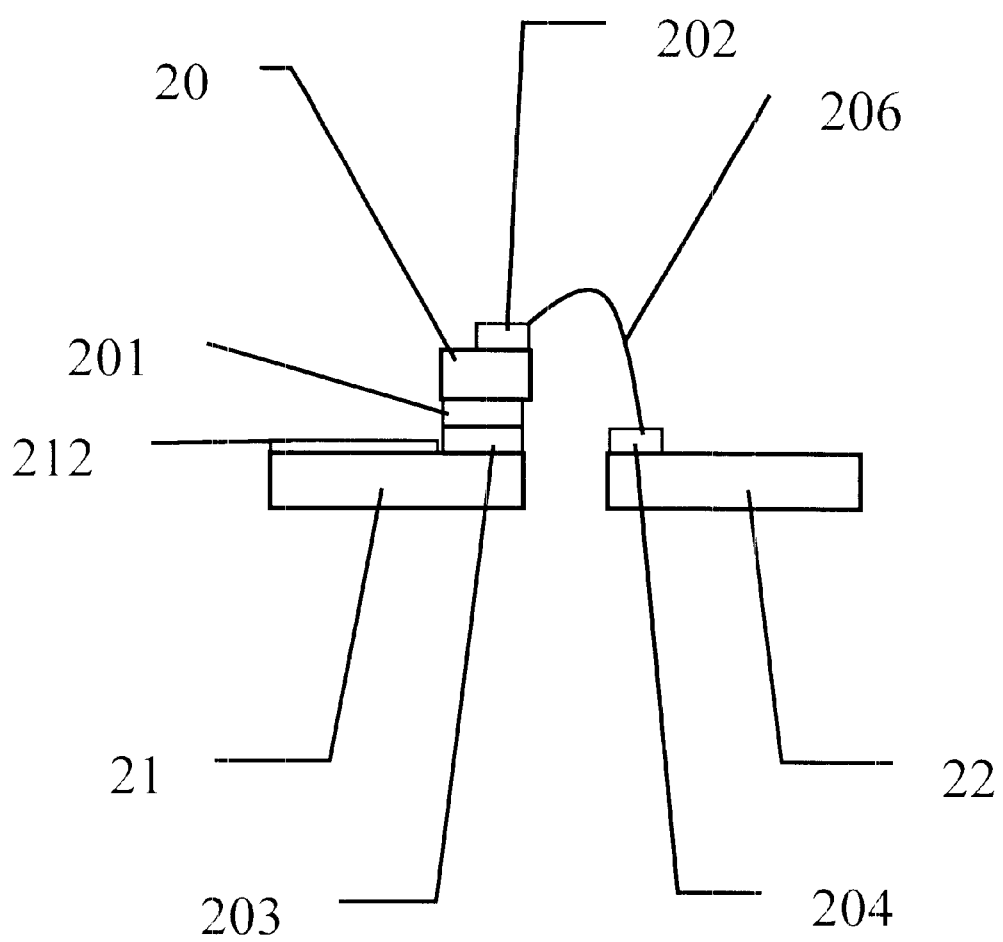
FIG. 5 shows a third embodiment of the present invention.

FIG. 5 shows a third embodiment of the present invention. The chip 20 has an electrode 201 at the bottom and another electrode 202 at the top of the chip 20. The bottom electrode 201 is mounted on a soldering pad 203 over the contact metal 21. The surface outside the solder point 203 is coated with an insulating material 212 to prevent spreading of the melted solder from the soldering pad 203. The top electrode 202 of the chip 20 is wire bonded to the soldering pad 204 on the metal contact 22.

Figure 6:
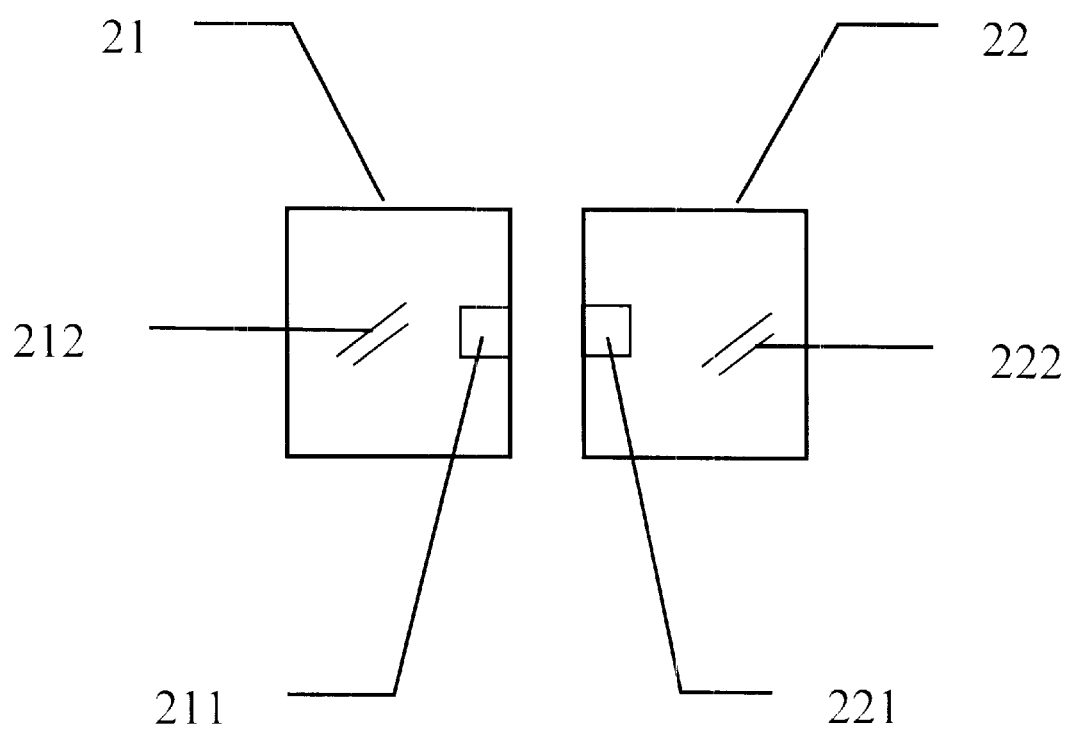
FIG. 6 shows a top view of the metal contact in FIG. 2.

FIG. 6 shows the top view of the metal contacts 21 and 22shown in FIG. 2. Outside the solder points 211 is the insulating coating 212 and outside the solder 221 is the insulating coating 222.

Figure 7:
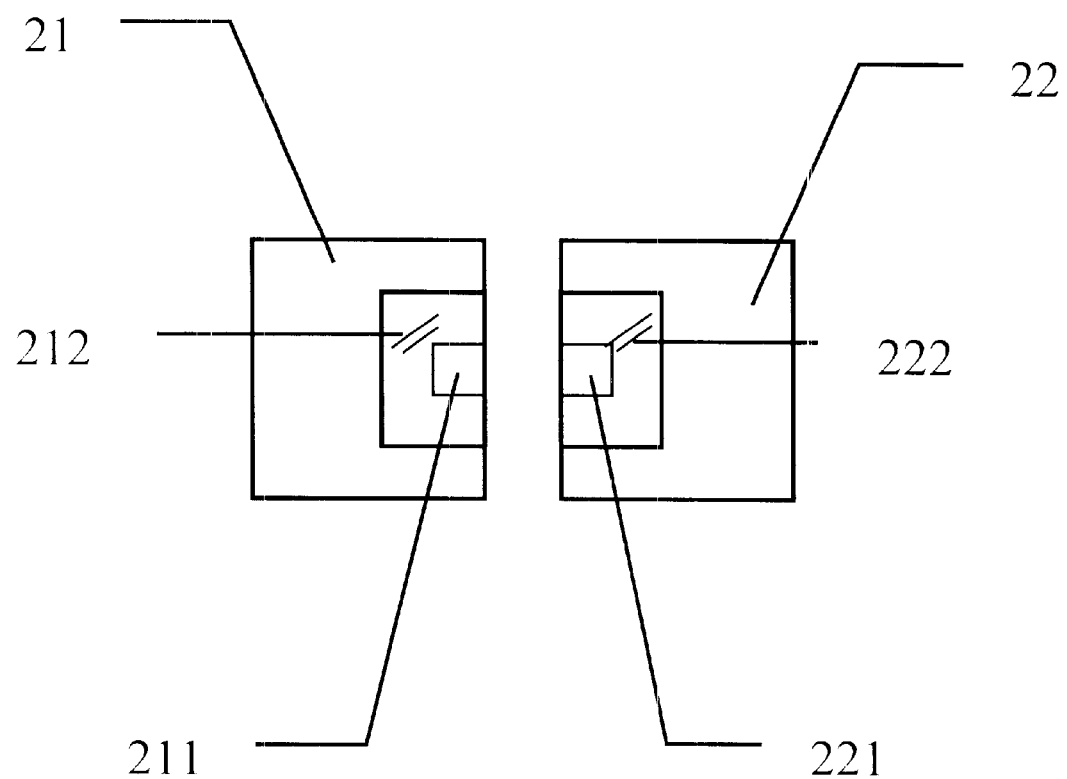
FIG. 7 shows a fourth embodiment of the present invention.

FIG. 7 shows the top view of a fourth embodiment of the present invention. The metal contact 21 is only partially coated with insulating material 212 outside the soldering pad 211. The metal contact 22 is only partially coated with insulating material 222 outside the soldering pad 221.

Figure 8:
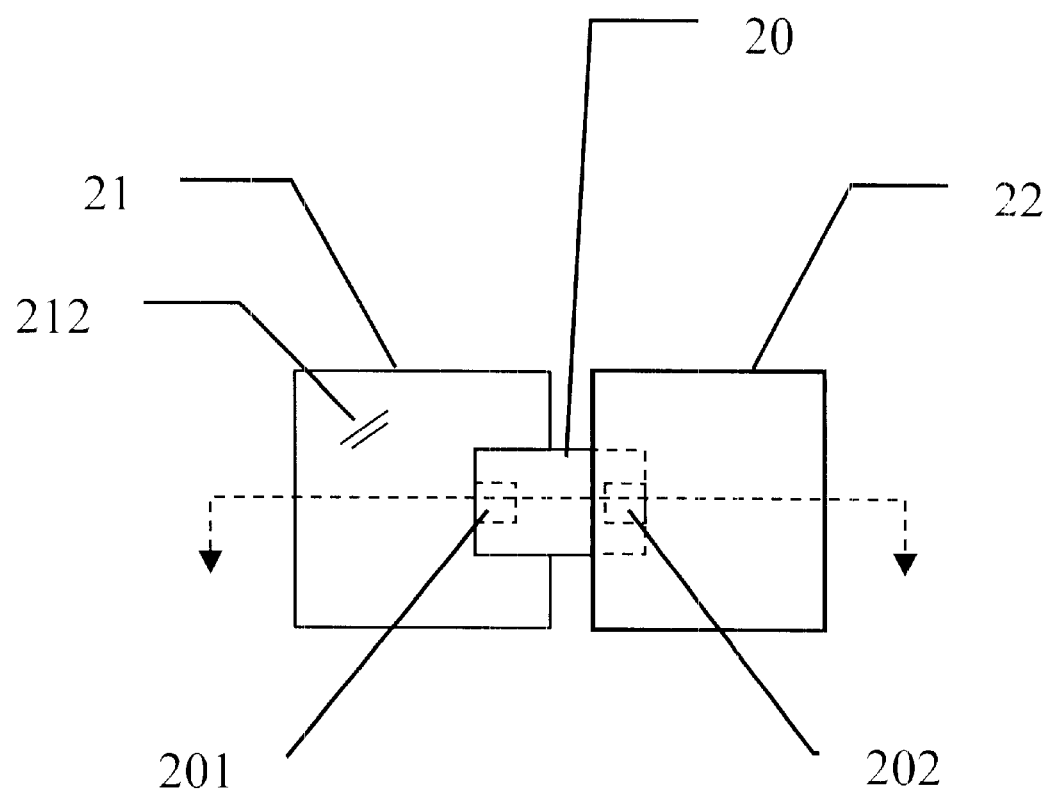
FIG. 8 shows a fifth embodiment of the present invention.
Figure 9:
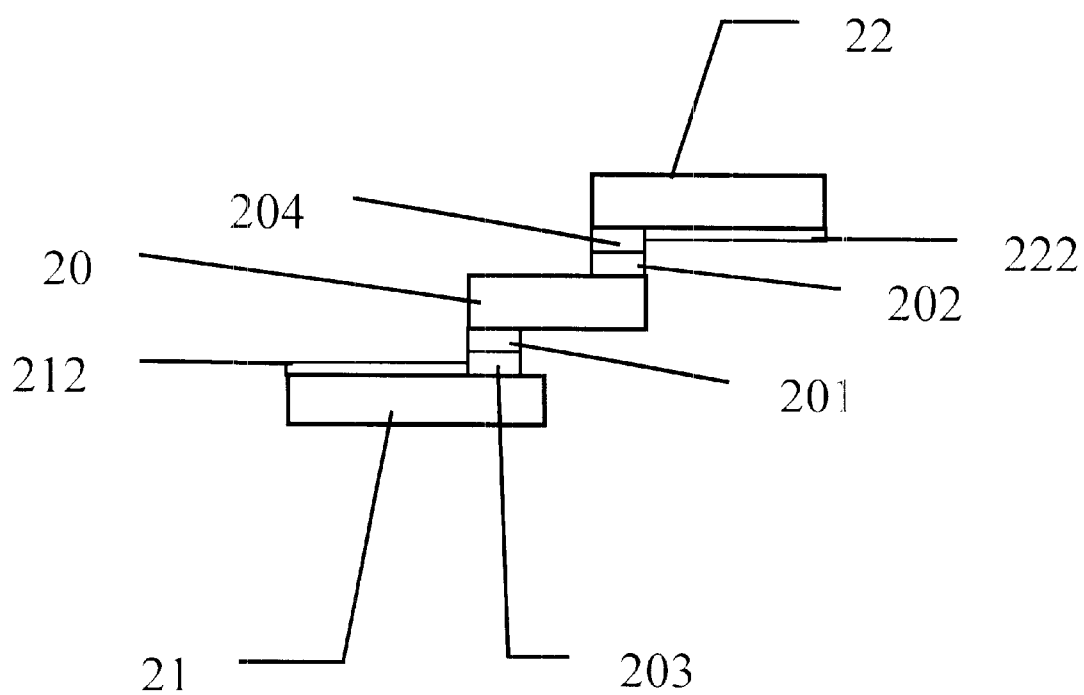
FIG. 9 shows a side view of FIG. 8
Figure 10:
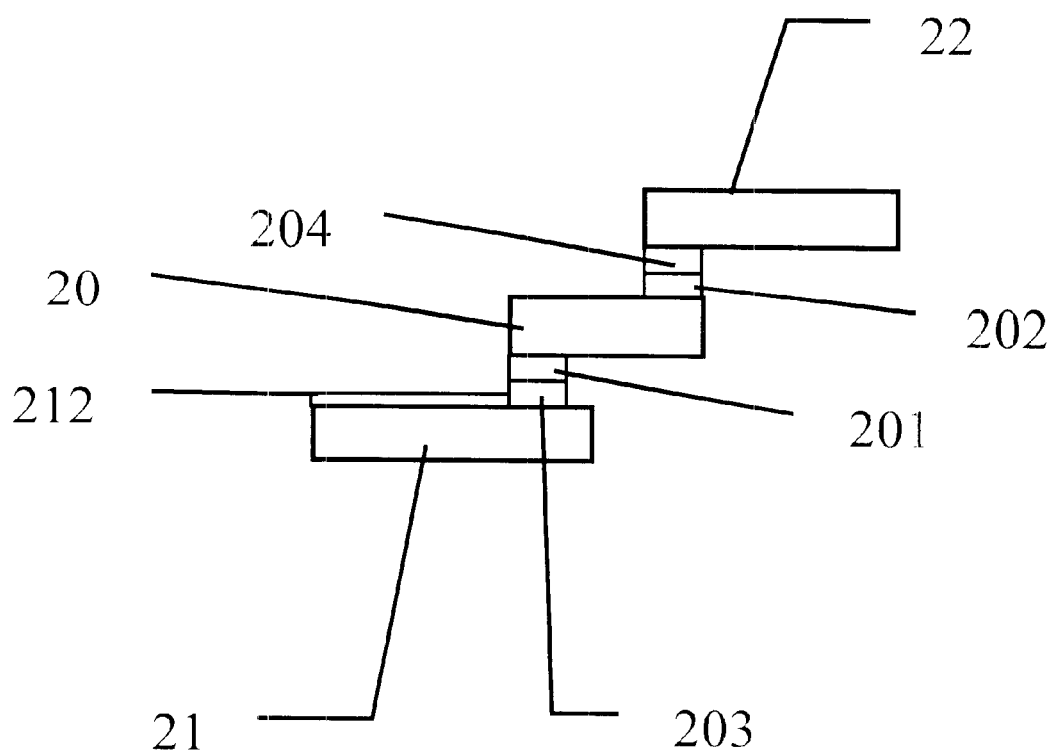
FIG. 10 shows another side view of FIG. 8.

FIG. 8 shows the top view of an eighth embodiment of the present invention. The chip 20 has electrode 202 on the topside and electrode 201 at the bottom side. The metal contact plates 21 and 22 are not coplanar. The electrode 201 makes contact with the bottom metal contact plate 21. Outside the soldering pad 203, which makes contact with the electrode 201 as shown in the side view FIG. 9, is coated with insulating material 212. The top electrode 202 of the chip 20 makes contact with the top metal contact plate 22. Outside the soldering pad 204, which makes contact with the electrode 202 as shown in FIG. 9, is coated with insulating material 222. The coatings 212 and 222 prevent the spreading of solder. The coating 222 may be eliminated as shown in FIG. 10. As in FIG. 4, coating on only one plate is sufficient to align the chip electrodes with the solder points.

While the preferred embodiments of the invention have been described, it will be apparent to those skilled in the art that various modifications may be made in the embodiments without departing from the spirit of the present invention. Such modifications are all within the scope of this invention.

What is claimed is:

1. A semiconductor device package, comprising:

a semiconductor chip having a first electrode and a second electrode;

a first metal contact plate having a first soldering connection coupled to said first electrode;

a second metal contact plate having a second soldering connection coupled to said second electrode; and insulating material surrounding one of said first soldering connection and said second soldering connection to prevent spreading of molten solders during soldering said semiconductor chip to said first metal contact plate and said second metal contact plate.

2. The semiconductor device package as described in claim 1, wherein said first electrode and said second electrode are on the same side of said semiconductor chip, and said first metal contact plate and said second metal contact plate are coplanar.

3. The semiconductor device package as described in claim 1 wherein said first electrode and said second electrode are at opposite sides of said semiconductor chip, and said first metal contact plate and said second metal contact plate are not coplanar.

4. The semiconductor device package as described in claim 1, wherein said coating is applied to both said first metal contact plate and said second metal contact plate.

5. The semiconductor device package as described in claim 1, where said coating covers partially at least one of said first metal contact plate and said second metal contact plate.

6. The semiconductor device package as described in claim 1, wherein said semiconductor chip is an optical device.

7. The semiconductor device package as described in claim 1, wherein said insulating material surrounds only three sides of said first electrode and said second electrode.

8. A semiconductor device package, comprising:

a semiconductor chip having a first electrode and a second electrode;

a first metal contact plate having a first soldering connection coupled to said first electrode;

a second metal contact plate having a second soldering connection coupled to said second electrode; and insulating material applied before said first soldering connection connecting to said first electrode and said second soldering connection connecting to said second electrode for coating one of said first metal contact plate and said second metal contact plate outside said first soldering connection and said second soldering connection to prevent spreading of melted solders during soldering said semiconductor chip to said first metal contact plate and said second contact metal plate, wherein said first electrode and said second electrode are at opposite sides of said semiconductor chip, said first soldering pad being coupled to said first electrode at the bottom of said chip, and surrounded with said coating, and said second soldering pad being wire-bonded bonded to the second electrode on top of said semiconductor chip and surrounded with said coating.

\* \* \* \* \*